United States Patent [19]

Stolwyk

[11] 3,917,401

[45] Nov. 4, 1975

[54] STEP AND REPEAT CONTROLLER

[75] Inventor: Carl F. Stolwyk, St. Louis, Mo.

[73] Assignee: McDonnell Douglas, St. Louis, Mo.

[22] Filed: Nov. 15, 1974

[21] Appl. No.: 523,970

[52] U.S. Cl. .................... 355/53; 310/9.8

[51] Int. Cl.[2] .................... G03B 27/42

[58] Field of Search ........... 355/53; 310/9.8; 333/30

[56] References Cited

UNITED STATES PATENTS

| | | | |
|---|---|---|---|
| 3,575,588 | 4/1971 | Hermann et al. | 355/53 X |
| 3,797,935 | 3/1974 | Marcy | 355/53 |

*Primary Examiner*—Richard A. Wintercorn
*Attorney, Agent, or Firm*—Charles B. Haverstock

[57] ABSTRACT

Apparatus for the accurate placement of the conductive members and electrodes of acoustic surface wave devices formed on the surface of a substrate such as a piezoelectric substrate including means for mounting the substrate for movement on the movable base portion of a camera device, said substrate having a conductive input transducer formed thereon, but being without any conductive electrodes. The apparatus includes a pick-up sensor mounted externally of the movable base in position adjacent to the substrate, and means responsive to a reference signal of the same frequency as the frequency at which the acoustic surface wave device being constructed is to operate for driving and accurately locating the movable members including the movable camera base. The apparatus includes a phasemeter which is used to accurately reposition the table (camera base) to each succeeding electrode image position so that the relative phase of all electrodes of the acoustic surface wave device is assured, a condition made possible by the present apparatus inasmuch as the photomasks employed are also prepared under control of similar step and repeat control means. The apparatus may alternatively employ means to count the cycles of the RF signal as the table is moved.

22 Claims, 12 Drawing Figures

STEP AND REPEAT CONTROLLER

The preparation of photomasks for the production of physically long microwave acoustic surface wave devices normally employs a step and repeat photographic process to accurately place or locate successive images of the electrodes on a photomask surface. The photomask thus produced is normally used to prepare an acoustic surface wave device by a photolithographic process by which the array of metallic electrodes is formed on the surface of a piezoelectric crystal substrate. The performance of acoustic surface wave devices constructed in this way dictates that the electrodes provided be placed very accurately. For example, a device having a length in a range up to about 10 inches requires an electrode placement accuracy of about 4 $\times 10^{-5}$ inches be maintained over the length of the substrate. Such electrode location accuracy is necessary to maintain since the position of the electrodes is calculated so that they will give the appropriate delay and phase characteristics for the device. The known techniques for electrode placement are subject to certain errors due mainly to (1) uncertainty as to the velocity of propagation over the chosen substrate material, and (2) positional errors in the known step and repeat processes.

One of the most important and fundamental requirements of any process used to locate the electrodes on a substrate is that the image of the electrodes be positioned on the photomask in such a manner that in the final acoustic surface wave device they will appear in-phase electrically to within a few degrees at the design center frequency. The present construction and technique assures this and other performance requirements through the direct measurement of electrode phasing using a reference acoustic surface wave delay line attached to a photomask camera. The present step and repeat control means therefore solves a difficult problem in the accurate construction of acoustic surface wave devices, and does so by providing means for controlling the accuracy of the electrode spacings on a photomask by direct reference to a particular parameter of interest in the acoustic surface wave device being constructed which is the relative electrical phase of the electrodes at the design center frequency. Furthermore, with the present means precise knowledge of the wave velocity is not required, and even a relatively poor estimate of the wave velocity is usually sufficient to produce a satisfactory device using the subject means and technique. Still further, with the present means and method the placement of the electrodes is not dependent on the accuracy of mechanical measurement or the control of table position.

It is therefore a principal object of the present invention to provide improved means and methods for producing acoustic surface wave devices.

Another object is to provide more accurate acoustic surface wave devices.

Another object is to improve the relative electrical phase characteristics of the electrode locations used on acoustic surface wave devices especially at the design center frequency.

Another object is to enable the accurate construction of acoustic surface wave devices without requiring precise knowledge as to the acoustic wave velocity of the propagated surface wave.

Another object is to teach the construction, operation and positioning of a step and repeat camera used in the preparation of photomasks used in the construction of acoustic surface wave devices.

Another object is to reference the positioning of a step and repeat camera to the measured phase delay of a surface wave device.

Another object is to reference the positioning of a step and repeat camera by means which count cycles of a propagated acoustic surface wave.

Another object is to teach the construction of a continuously variable acoustic surface wave delay line device used to measure linear displacement with extreme accuracy.

Another object is to provide means to assure accurate electrode spacing and phasing of a typical acoustic surface wave device by controlling the construction process of photomasks used in the construction of acoustic surface wave devices.

Another object is to produce acoustic surface wave devices using a reference drive signal at exactly the same frequency as the frequency at which the final acoustic surface wave device will operate.

Another object is to teach the use of means to count the cycles of an RF signal used for producing acoustic surface wave devices as a movable portion of the device is moved from one position to another, said counting means including means to assure the accurate absolute spacing of the electrode image locations on a photomask.

These and other objects and advantages of the present invention will become apparent after considering the following detailed specification in conjunction with the accompanying drawings, wherein.

Figures 1, 2:
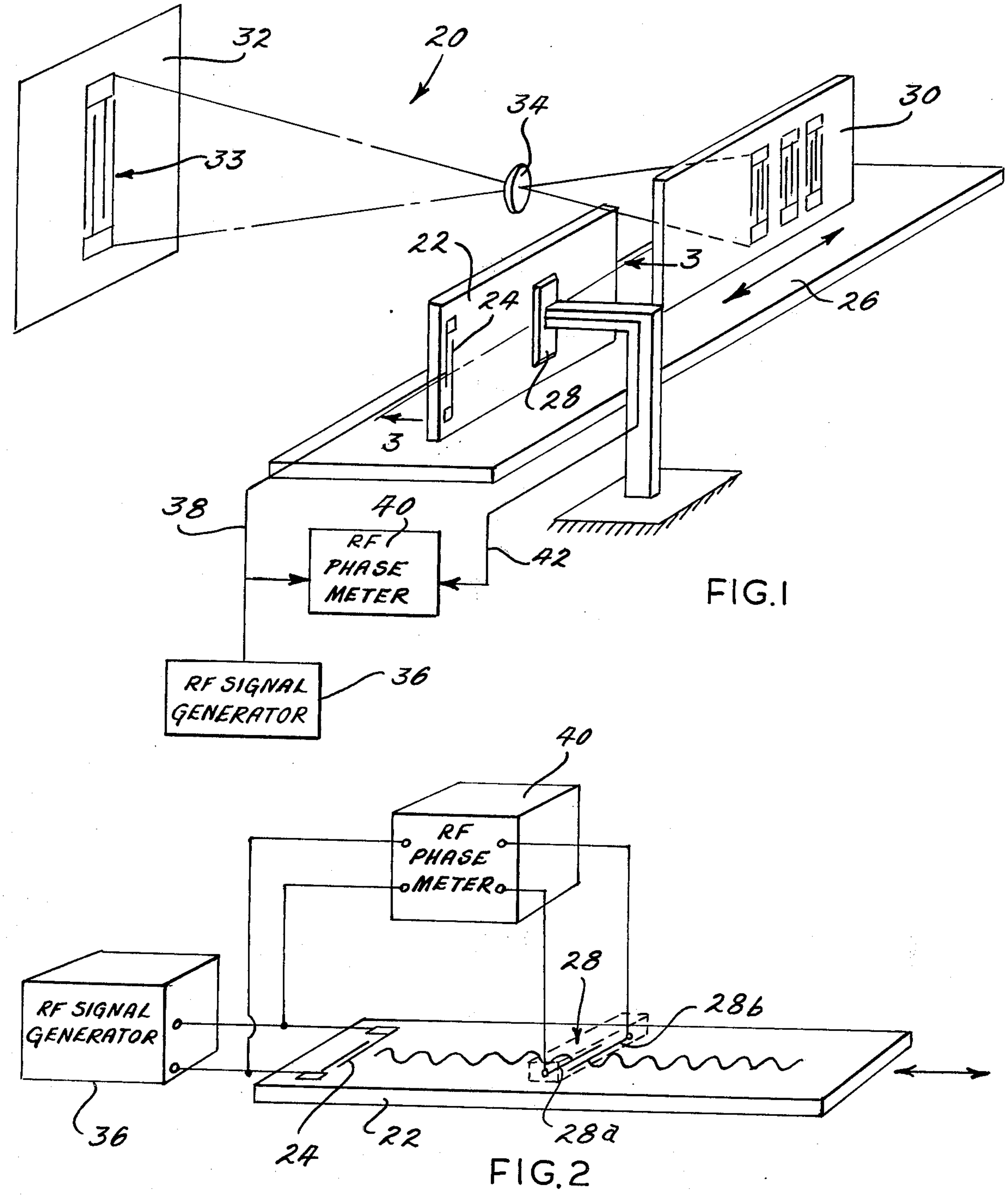
FIG. 1 is a perspective view of an apparatus for use in the production of photomasks used in construction of surface wave devices constructed according to one embodiment of the present invention.
FIG. 2 is a simplified perspective view showing the phase position sensor means used in the subject construction.

Referring to the drawings more particularly by reference numbers, the camera means shown in FIG. 1 are generally identified by number 20 and a surface wave delay line device by number 22. The device 22 is shown having an input transducer portion 24 formed thereon which is comprised of an interdigital array of parallel electrodes, but the device is shown without additional electrodes. The electrodes which will be described later are to be formed and located using the acoustic surface wave delay line device 22 as will be explained.

The acoustic surface wave delay line device 22 is attached to and mounted for movement with base element 26 of the camera 20. The surface wave delay line device 22 is made of the same substrate material and has the same crystal orientation as that of the acoustic surface wave device to be fabricated using the photomask 30 which will be described later. A stationary pick-up sensor 28 is mounted externally of the movable base 26 and is held in a fixed position adjacent to the surface of the acoustic surface wave delay line device 22 as shown so that when the base 26 moves, the member 22 will move relative to the sensor 28. During operation of the device, the camera base 26 and the acoustic surface wave delay line device 22 mounted thereon are driven by an RF signal which is selected to be of exactly the same frequency as the frequency at which the final acoustic surface wave device will be operated. This signal is introduced at the input transducer 24 and propagates over the surface of the device.

A photomask 30 normally consists of a photosensitive plate and is also mounted on the movable camera base or table 26 in the manner illustrated in FIG. 1, and the photomask 30 is in optical communication with a master drawing or template 32 which has a drawing or other pictorial representation 33 of the desired electrode construction formed thereon as shown. The master drawing 33 on the template 32 is in optical communication with the photomask 30 through optical means shown as camera lens means 34. The idea is to locate the base 26 and the photomask 30 in proper positions to expose the photomask 30 to the representation 33 to form a photo image of the electrode representation at proper accurately located positions thereon. Each electrode image is individually formed in this way.

In another embodiment of the subject invention, the photomask 30 consists of a piezoelectric crystal substrate with the same structure and crystal orientation as the device 22. The substrate photomask 30 is coated with photosensitive material as before and is mounted on the movable camera base or table 26 in the manner illustrated in FIG. 1, and the substrate photomask is in optical communication with the master drawing or template 33 of the desired electrode construction. The substrate photomask 30 is positioned as before and exposed to the representation 33 to form a photo image of the electrode representation at proper accurately located positions thereon. After individually exposing each electrode image in this manner, the substrate photomask is processed using conventional photolithographic methods to deposit a thin film of metal to form electrodes at the exact positions of the electrode images of the previous photographic exposure. In this way, an acoustic surface wave device is formed directly without the need for the preparation of an intermediate photomask.

The subject construction has a reference frequency signal source 36 which has a first connection to the input transducer 24 formed on the acoustic surface wave delay line 22 by way of lead 38. These are the signals that are propagated over the surface of the device 22. The output of the RF signal generator 36 is also connected to one input of a phasemeter 40, and the phasemeter 40 has a second input at which it receives other inputs on lead 42 from the stationary pick-off transducer 28. The purpose of the phasemeter 40 is to measure the electrical displacement of the surface wave delay line 22. Comparison of the phases of the two signals received by the phasemeter 40 provides a very accurate way to locate the electrode positions on the photomask. For example, a zero phase difference between these signals can be used to locate the electrodes, and each time the desired relationship is established by locating the delay line device 22 relative to the stationary transducer 28 another exposure is made between the representations 33 and the photomask 30.

FIG. 2 shows more of the details of the circuitry for the RF signal generator 36 and of the phasemeter 40. For example, the phasemeter 40 is shown having two input leads which connect it to opposite ends to pick-off or transducer 28 and two other leads which connect it to the frequency source and to opposite ends of the input transducer 24. The pick-off 28 is shown as being a member having two or more parallel electrodes 28a and 28b formed on the surface thereof adjacent to the device 22 and the conductors may be similar in construction to some of the electrode conductors used on the acoustic surface wave device to be constructed. The input transducer 24 likewise is formed by two or more parallel spaced electrodes.

Figure 3:
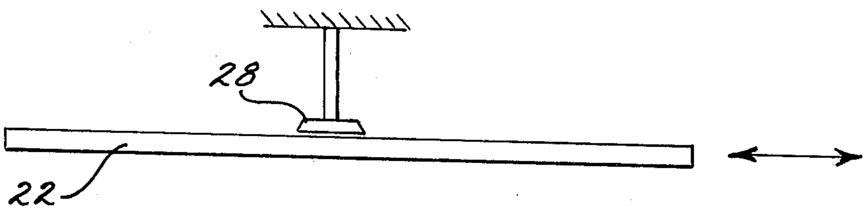
FIG. 3 is a fragmentary cross-sectional view taken on line 3—3 of FIG. 1.

FIG. 3 shows the closely spaced relationship between the pick-off transducer 28 and the surface of the acoustic surface wave delay line device 22. The closer these members are the better will be the ability of the transducer 28 to sense the propagated signals but these members 22 and 28 must also be spaced to permit relative movement therebetween. During operation, the acoustic surface wave delay line device 22 will be moved with the movable camera base portion 26 to different positions relative to the stationary pick-off 28 as determined by the responses of the phasemeter 40. As explained, the purpose of the subject device is to accurately locate a plurality of spaced images of electrodes on the substrate or photomask 30 relative to each other and relative to an input transducer thereon which may be similar to the input transducer 24. This is accomplished using the camera means 20, the phasemeter 40, and the RF signal generator 36 as aforesaid. For best operation the RF signal generator 36 should be adjusted to generate an output signal that is of the same frequency as the center frequency of operation for the acoustic surface wave device that is being produced.

The technique of the subject invention depends on the property of acoustic surface wave devices which makes it possible for the transducer 28 to be able to sense a propagated surface wave signal at different locations without being bonded to the substrate or surface wave device. This being the case, the movements of the substrate 22 relative to the pick-off 28 will make the subject device act very much like a continuously variable delay line.

In operation, the camera is initially positioned approximately at a location corresponding to the location of the first electrode image to be formed. In this position the table or movable camera base 26 is adjusted to establish an initial reference phase relationship between the two signals it is receiving, and this phase relationship preferably should be easily recognized and reproduceable in the phasemeter 40. A relationship such as a zero degree phase relationship may be desired for this purpose. After exposing the first electrode image using the camera means and while the device in the position described the table is moved to a second position corresponding to the location for the second electrode, and again the position of the table 26 is adjusted to reestablish the same initial reference phase relationship and another camera exposure is made. This process is repeated for all subsequent electrode locations along the photomask, and by this process the relative phase between all of the electrodes in the final acoustic surface wave device prepared from the photomask is assured since the photomask is prepared under control of the same setting conditions as are established by the phasemeter 40.

When this technique is used it is not necessary to have a precise knowledge of acoustic wave velocity of the piezoelectric members or of the mechanical position in order to produce an accurate acoustic surface wave device. This is an important advantage over all known prior art methods of constructing such devices and substantially improved operating characteristics are achieved by the present method. Furthermore, with the present device accurate, absolute electrode spacing is assured and can be verified such as by using means that count cycles of the propagated RF signal as the table 26 is moved.

The preparation of photomasks such as the photomask 30 particularly when they are to be used as physically relatively long microwave acoustic surface wave devices normally employs a step and repeat process to accurately place successive images of the electrodes. As indicated, accurate electrode placement is extremely critical and must be to an accuracy of about 4 $\times 10^{-5}$ inches or better over the length of the substrate in typical devices ranging upwardly from about 10 inches in length. Furthermore, the positions of the electrodes is calculated to give the appropriate delay and phase characteristics to the devices and these parameters are the ones which must be accurate if the device is to serve its desired purpose. The subject means and method assure such electrode placement and such performance through the direct measurement of the electrode phase using a reference acoustic surface wave delay line attached to the photomask camera.

In order to obtain precise phase control in the step and repeat process described, the acoustic surface wave delay line 22 with its input transducer 24, but without additional electrodes, is attached to the movable base 26 and as stated, the device 22 is made of the same substrate material and crystal orientation as that of the device to be constructed using the photomask 30. The device is then driven at the center frequency of the device that is being produced, and the relative phase of the reference input and of the pick-off signals is measured using the phasemeter 40 connected as indicated. Also as indicated, precise knowledge of the propagation wave velocity is not required when using the subject device and even a relatively poor estimate as to wave velocity is sufficient to produce an acoustic surface wave device having good operational characteristics. Furthermore, the present device does not depend on or require any mechanical measurements in the range of accuracy required, and mechanical measurements will vary with the type of substrate material because the velocity of propagation of a surface wave depends on the characteristics of the substrate material. All of these factors are automatically taken into account in the present construction, and as long as the surface wave device to be constructed is to be duplicated on the same or similar substrate materials the accuracy and uniformity of the devices will be maintained.

The technical value of surface wave delay line devices used in the preformance of signal processing and filtering is widely recognized. Such devices have been difficult to accurately construct for the reasons stated, and they commonly are constructed using piezoelectric crystal substrate materials upon which metal electrodes are formed or deposited. When an electrical signal is applied to one of the electrodes it introduces physical stress in the surface of the crystal which excites an acoustic wave thereon and the wave travels down the length of the device at a velocity that depends upon the characteristics of the substrate material. Typical propagation velocities range from about 1,000 to about 4,000 meters per second. It is also known to such devices that as a propagated wave passes each of the other electrodes as it moves along and over the surface it will produce a signal thereat and these signals commonly are replicas of the applied electrical signal but delayed by an amount of time determined by the spacing between the electrodes. The accuracy with which the electrodes are spaced is therefore extremely important if it is required to determine the magnitude of a delay or phase change for some purpose such for example as to measure a distance and so forth. Furthermore, the signals that are produced at many such electrodes or taps can be electrically combined to perform many useful functions including signal processing, filtering and other signal delay operations. Obviously, all of these functions depend for their accuracy on the accuracy of the placement of the electrodes. The present invention overcomes many of the problems encountered in the prior means and methods for constructing such devices including those mentioned above which relate especially to the difficulty of being able to make accurate physical measurements and the inability heretofore to make the placement under conditions such as are encountered under actual operating conditions.

Photomasks of various types have been used in the construction of such devices in the past and have usually involved metalizing the electrode patterns onto the substrate using well known processes including masking processes, and vapor deposition processes. For physically long multi-electrode devices, the preparation of a photomask has usually been accomplished by photoreduction of a large scale drawing of a single electrode such as that shown in FIG. 1. The camera then exposes the image of the electrode on the photomask and the photomask is thereafter moved to another position corresponding to the next electrode position and another exposure is made. The step and repeat processes used heretofore are repeated as many times as necessary using a mechanically driven mounting base and measuring the distance traveled. To achieve the desired electrical phase relationship between the electrodes in such a process, it is necessary to know with great precision the velocity of propagation of the surface wave in order to calculate the required distance between the electrodes and the distance the camera or photomask must move. Further difficulties are encountered in the accurate measurement or placement of the step and repeat process by mechanical or optical means as currently employed and the known processes do not use a so-called master or reference acoustic surface wave delay line device as is the case with the present device, and therefore each new device made using the known techniques will have its own different characteristics and will not be referenced to a common standard. Thus it can be seen that the present process removes the uncertainity of not knowing the exact velocity of propagation and overcomes the erros inherent in mechanical positioning devices and processes. Also by having all of the surface wave devices constructed using the same reference member of similar substrate material enables direct measurement of the properties of electrode phasing, electrode spacing, and delay between the finished devices and provides greatly improved uniformity of the finished devices.

Figure 4:
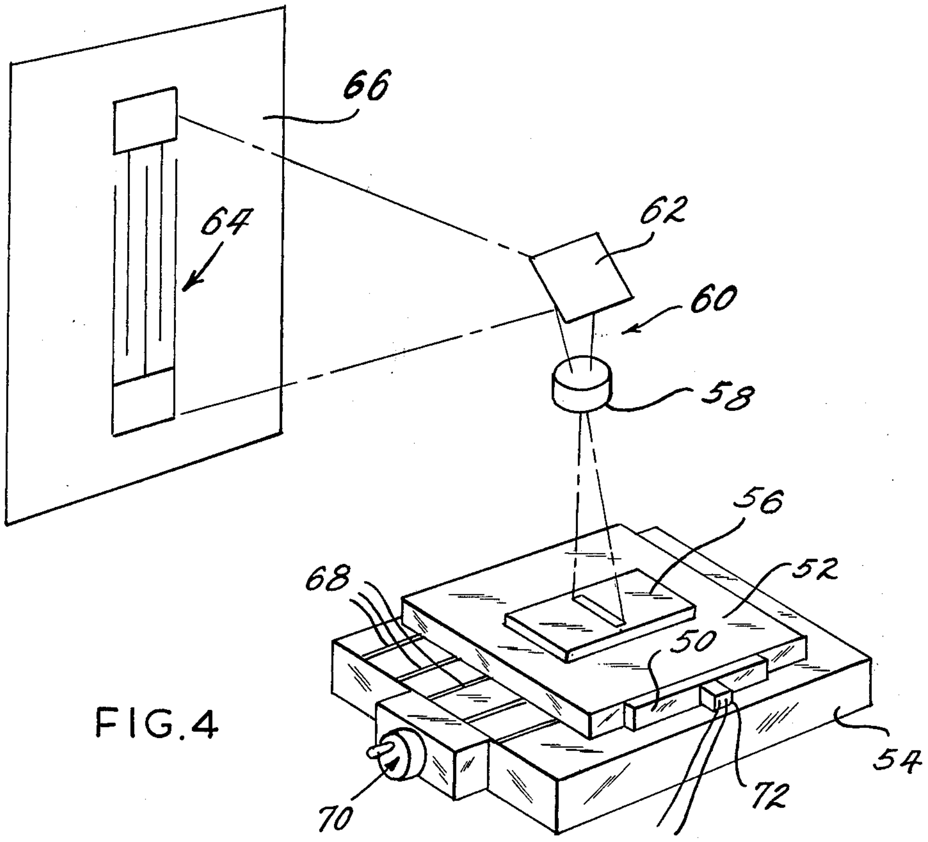
FIG. 4 is another perspective view showing more of the details of the camera means employed in the subject construction.
Figure 5:
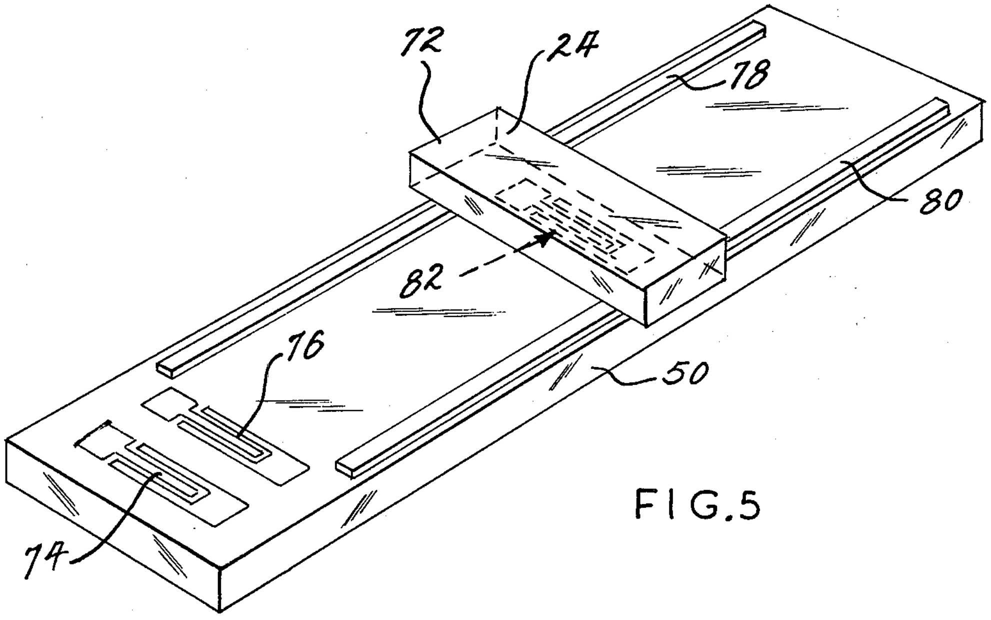
FIG. 5 is a perspective view showing the use of a variable transducer in connection with the subject construction.
Figure 6:
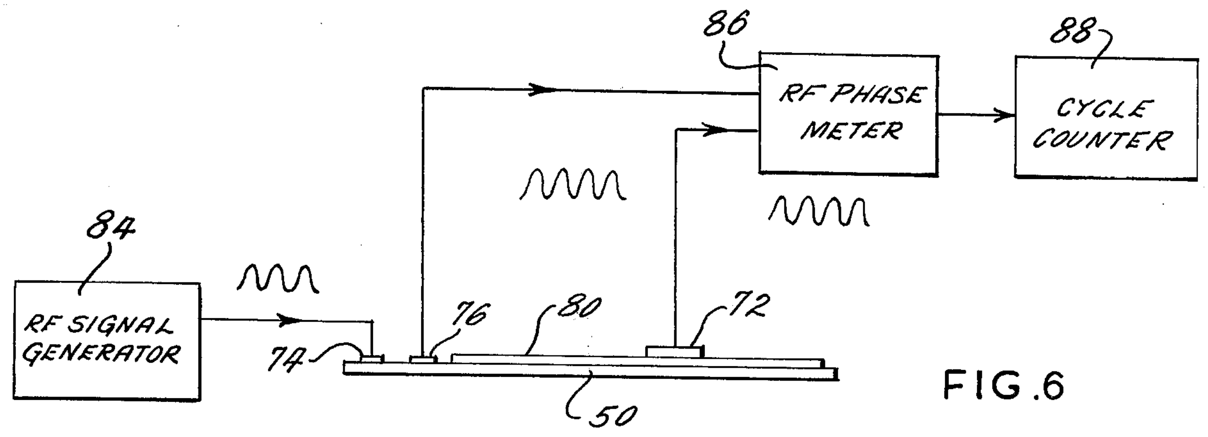
FIG. 6 is a block diagram showing another form of phase position sensor means in connection with the variable transducer of FIG. 5 and with an up-down counting means to locate the variable transducer.

FIGS. 4–6 show another embodiment of the subject device wherein the reference acoustic surface wave delay line 50 is mounted for movement on a movable mounting base 52 which in turn is movable on a stationary or fixed base or table 54. The photomask 56 is also mounted on the movable base 52 but in a different position thereon than in the structure described above. A camera lens and shutter assembly 58 is positioned in spaced relationship above the photomask 56, and the camera means 60 also is shown including a mirror 62 positioned to expose an enlarged artwork image 64 of an electrode on sheet 66 to the photomask 56 through the lens and shutter assembly. The artwork image 64 is a large scale representation of a single electrode to be formed on the photomask 56.

The movable mounting base 52 is supported for movement on spaced tracks or rails 68 formed on the upper surface of the stationary base 54, and movement of the base 52 relative to the base 54 is controlled by means of a vernier knob assembly 70 which is geared to produce the said relative movement. When the knob 70 is rotated in one direction the movable mounting base 52 and the members mounted thereon move in one direction relative to the fixed base 54 and when rotated in the opposite direction the movable members will move in the opposite direction. The embodiment shown in FIG. 4 includes a variable electrode transducer or assembly 72 which is similar to the transducer assembly 28 and is preferably constructed of a type of substrate material similar to that of the device 50. The variable transducer 72 is fixedly attached to the stationary base 54, and when the movable base 52 is moved relative to the stationary base 54, as aforesaid, the acoustic surface wave delay line 50 will move relative to the variable transducer 72 and will produce output responses when an output radio frequency signal is propagated over the surface thereof. The operation of the embodiment shown in FIG. 4 is similar to that of the construction described above in connection with FIGS. 1–3.

FIG. 5 shows more of the details of the acoustic surface wave delay line device such as the device 50 and of the variable transducer assembly 72 associated therewith. In this case, the reference piezoelectric device 50 has formed thereon an input transducer 74 and a reference transducer 76 both of which may be similar in construction. Also, the acoustic surface wave device 50 has a pair of spaced rails 78 and 80 deposited or otherwise formed thereon adjacent opposite sides, and these rails 78 and 80 are slideably engaged by the variable transducer 72 during relative movements therebetween and maintain the members in closely spaced relationship. The variable transducer 72 has electrodes or conductors 82 deposited or otherwise formed on the surface thereof that is closest to the reference substrate member 50. When an electric signal is applied to the input transducer 74 and excites a surface wave that propagates along the length of the substrate 50, it can be detected by the variable transducer 72 and it will also appear as an output signal at the reference transducer 76 a very short time after it is propagated from the input transducer 74. The signal when detected by the variable transducer 72 will be detected some time after it passes the reference tap 76. The amount of the delay between when the signal is detected at the reference transducer 76 and at the variable transducer 72 can be adjusted by moving the variable transducer 72 along the device on the two rails 78 and 80 thereby permitting the assembly to operate as a continuously variable delay line. The relative displacement of the variable transducer 72 can then be accurately determined by measuring the relative phase or time delay of the signal detected at the reference transducer 76 and at the variable transducer 72. These measurements may be made in several ways as will be explained.

One way to measure the relative phase or time delay is by a direct measurement technique which involves the measurement of the phase shift. This technique is illustrated in FIG. 6. In this technique an RF signal generator 84 is connected to drive the input transducer 74 with an RF signal at the RF center frequency for which the photomask 56 is being prepared. This drive signal induces a replica surface wave which propagates down the substrate 50 at a velocity which is characteristic of the particular substrate material. This surface wave produces a signal at the reference transducer 76 and later at the variable transducer 72 both of which are connected as inputs to the RF phase member 86. During the operation, the variable transducer 72 is initially positioned near the reference transducer 76 and is adjusted in position to give a zero reading on the phasemeter 86 to indicate the location for the desired electrode to be formed on the member 56. At the same time another meter called up/down counter 88, and which is connected to the phasemeter 86, is reset to a zero count condition. The position just described is the reference position for the device and in this position the first exposure is made on the photomask as described and disclosed in connection with FIG. 4. Thereafter, the movable base 52 is moved by means of the knob assembly 70 to another position which is a distance equal to the desired electrical distance for the next exposure. The exact location of the next position is produced by reestablishing the zero or other reference condition at a new location that is spaced from the input transducer 74 and from the reference transducer 76 by some predetermined amount.

Figure 7:
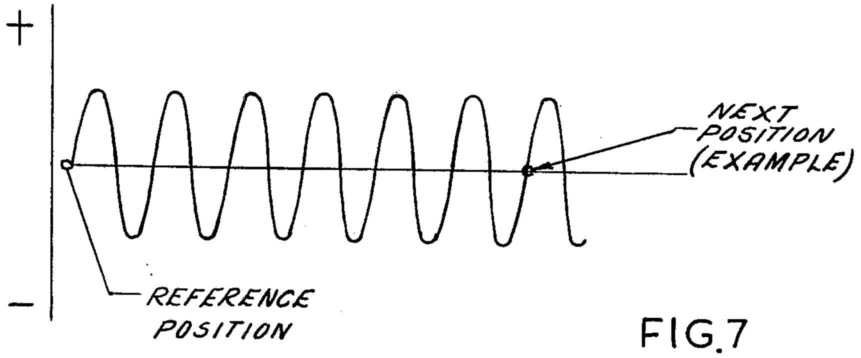
FIGS. 7 and 8 are graphs respectively of phasemeter output, and of up/down counter output as functions of the displacement of the variable transducer.
Figure 8:
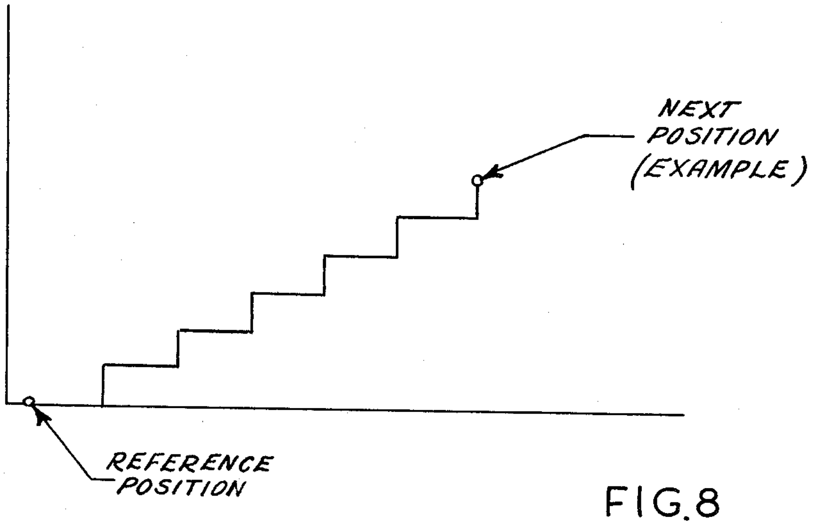

As the variable transducer 72 moves with respect to the reference transducer 76, the outputs of the phasemeter 86 and the cycle counter 88 will change. For example, as the variable transducer 72 moves away from the reference transducer 76 the outputs will appear as shown in FIGS. 7 and 8, that is the phase will follow the wave form and the up/down counter will count cycles of the propagated wave. The position of the mounting base 52 is adjusted until the desired number of cycles has been counted by the up/down counter 88, and this will provide a coarse setting adjustment for the next electrode location. Fine adjustment can then be made as aforesaid by obtaining a zero reading on the phasemeter 86. At the new setting position (FIGS. 7 and 8) a new exposure is made on the photomask in the same manner as before and the location of this new exposure will be separated from the position of the last exposure by the desired number of RF cycles and will occur at exactly an in-phase condition with the first or reference position. This procedure is repeated successively to produce as many electrode positions as desired. The desired electrode positions and electrical phasing of the surface wave device 50 produced on the photomask will be assured since the photomask exposures are controlled using a substrate formed of the same piezoelectric material as is intended for the final acoustic surface wave device, and the phase measurements are all made at the same frequency (the center operating frequency) that the device itself will operate at. As stated, using this process for locating the electrodes, it is not necessary to have knowledge of the surface wave velocity of the material involved nor is it necessary to make any precise mechanical measurements. These are important advantages.

Figure 9:
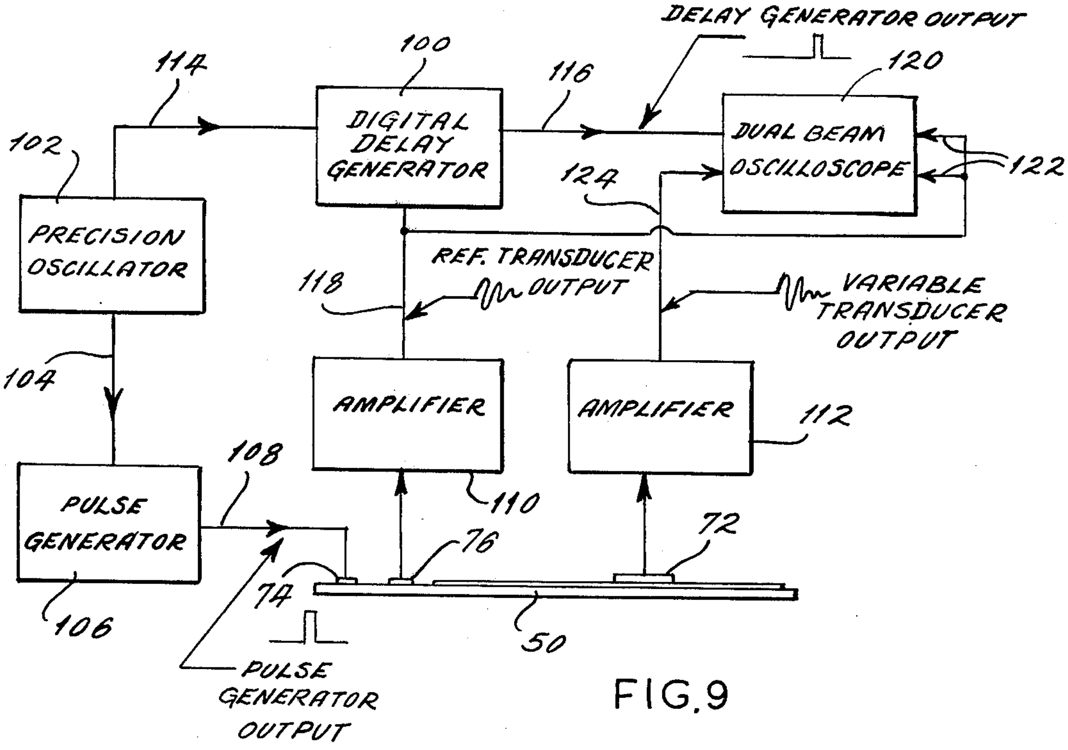
FIG. 9 is a block diagram of a typical circuit for use in connection with the construction shown in FIG. 6.
Figure 10:
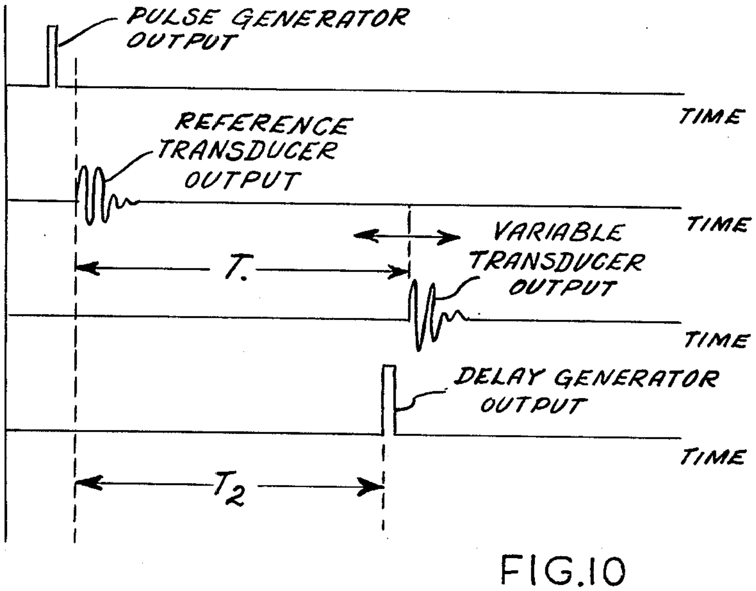
FIG. 10 are graphs of the timing of different signals for use with the subject device.

A second technique involving basically the same structure but somewhat different electronic circuitry is illustrated in FIG. 9. When this circuit is used the time delay of a pulse appearing at the reference transducer 76 and at the variable transducer 72 is measured with the aid of a digital delay generator 100. The circuit of FIG. 9 includes a precision oscillator 102 which provides a repetitive signal on lead 104. This repetitive signal is used to trigger a pulse generator 106 which in turn produces a pulse output on lead 108 for each cycle of the input signal from the oscillator 102. These pulses are applied to the input transducer 74 where they excite an acoustic surface wave pulse which propagates over the substrate member 50. This surface wave in turn produces electric outputs at the reference transducer 76 and delayed pulses at the variable transducer 72. The pulses sensed at the reference transducer 76 and at variable transducer 72 are amplified by respective amplifier circuits 110 and 112.

Figure 11:
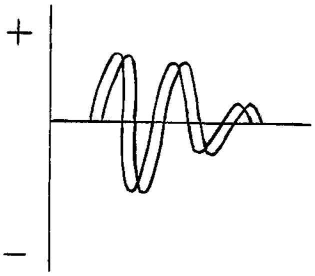
FIG. 11 is a graph of oscilloscope output for a particular condition where the timing $T_1$ of one signal is approximately equal to the timing condition $T_2$ of another signal; and, FIG. 12 is an oscilloscope graph similar to the graph of FIG. 11 for the condition where the $T_1$ exactly equals $T_2$.
Figure 12:
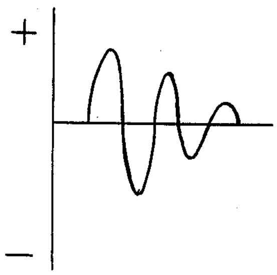

The precision oscillator 102 produces other output pulses on lead 114 which are applied to the digital delay generator 100, and the generator 100 produces output pulses on lead 116 which are delayed by some precise time $T_2$ which occurs after the reference transducer output has appeared on lead 118 in the output of the amplifier circuit 110. The amount of this delay can be selected and varied by means including in the delay generator 100. The amplifier outputs produced at the reference transducer 76 appearing on the lead 118 are also connected as inputs to the delay generator 100 and as inputs to synchronization channel inputs of a dual-beam oscilloscope 120. These signals appear on leads 122. The oscilloscope 120 also receives as delayed inputs the outputs from the variable transducer 72 which appear on lead 124. These outputs are delayed by an amount of time $T_1$ which is determined by or represents the separation or distance between the variable transducer 72 and the reference transducer 76. The outputs from the variable transducer 72 will therefore appear on the oscilloscope 120 only when the delay set in the delay generator 100 ($T_2$) and the value of $T_1$ are approximately the same as illustrated by the two signals shown in FIG. 11. Slight adjustment in the position of the variable transducer 72 or in the setting of the delay generator 100 will result in time coincidence of these signals, namely, the signals appearing on the leads 118 and 124, and when this adjustment is made the condition will appear as shown in FIG. 12.

The two means disclosed herein for accurately locating the positions of the electrodes are similar and are achieved by similar step and repeat operations, the principal difference between the two processes being in the circuitry selected for achieving same. When each time coincidence ($T_1 = T_2$) is obtained using the structure of FIG. 9, as in the construction of FIG. 6, an exposure is made on the photomask to locate the corresponding electrode and the variable transducer is then moved to the next position and coincidence is again established and another exposure is made. This is repeated until the desired number of electrodes are located. In the construction of FIG. 9, however, the coincidences are obtained by observing images on a cathode ray tube rather than by obtaining coincidence using a zero reading on a phasemeter. The results obtained in either case are basically the same and in each case an acoustic surface wave device is achieved in which the electrode locations are properly positioned and in each case this is accomplished without reference to mechanical measuring or aligning devices and without knowledge of the wave velocity. Many variations in the structure and circuitry for achieving the subject results are possible and the examples and constructions shown herein are for illustrative purposes only and are not intended to be exhaustive of the possibilities.

Thus there has been shown and described a novel step and repeat controlled device which is particularly useful and accurate for locating the electrode images on a photomask used in the construction of acoustic surface wave devices to increase the operating accuracy and usefulness of such devices. It will be apparent to those skilled in the art, however, that many changes, variations, modifications and other uses and applications of the subject means are possible. All such changes, variations, modifications and other uses and applications which do not depart from the spirit and scope of the invention are deemed to be covered by the invention which is limited only by the claims which follow.

What is claimed is:

1. Means for locating electrode image positions on a photomask to be used in the construction of acoustic surface wave devices comprising an acoustic surface wave device having a surface over which signals are propagated, an input transducer located on said surface, means connected to excite said input transducer to propagate a signal therefrom over the surface, means for sensing a propagated signal at different locations on the surface including a sensor member movable relative to the surface, other means forming a photomask and means fixedly connecting the photomask to the surface wave device for movement therewith relative to the sensor member, camera means including means for exposing the photomask to an image to be formed thereon, circuit means having separate input connections to the sensor member and to the input transducer, said circuit means including means for indicating a predetermined relationship between the signal applied at the input transducer and the propagated signal as sensed at different locations by the sensor member, said last named means including means for establishing different positions on the photomask for exposure to the camera means, said different positions establishing positions for exposing the photomask to the optical image.

2. Means for locating electrode images on a photomask comprising a crystal member having a surface formed thereon over which signals are propagated, means forming an input transducer on said surface from which signals are propagated over the surface, said input transducer including spaced parallel electrodes formed on said surface and extending transversely to the direction of signal propagation, means forming a reference transducer on the surface at a location spaced from the input transducer in the direction of signal propagation, a variable transducer positioned adjacent to the surface and movable relative thereto, said variable transducer responding to a signal being propagated at different positions as it is being propagated, a photomask member, means mounting the crystal member and the photomask member for movement in concert relative to the variable transducer, means for applying a drive signal to the input transducer for propagation over the surface of the crystal member, and other means including phase sensitive means having a first connection to the reference transducer and a second connection to the variable transducer, said phasemeter including means to indicate the relative phase between the propagated signal as sensed at the reference transducer and as sensed by the variable transducer, and camera means including a pictorial repesentation of an electrode and means for exposing the photomask to the pictorial representation in different preselected positions of the crystal member relative to the variable transducer depending on particular phase relationships indicated on the phasemeter.

3. The means for locating electrode images defined in claim 2 wherein the particular relationships as indicated by the phasemeter are for the same phase but for different positions of the variable transducer relative to the crystal member.

4. The means for locating electrode images defined in claim 2 including means for counting cycles of the propagated signals for movements of the variable transducer relative to the crystal member, the phasemeter being used to establish preselected phase indications for different locations of the variable transducer relative to the crystal member as determined by the cycle counting means.

5. The means for locating electrode images defined in claim 4 wherein the variable transducer is coarse located relative to the input transducer on the crystal member at different spaced positions corresponding to different predetermined numbers of cycles of the propagated signals as measured during movements of the variable transducer toward and away from the input transducer.

6. Means for locating electrode positions in the construction of an acoustic surface wave device comprising a crystal member having a surface formed thereon over which signals are propagated, input transducer means at which signals to be propagated are introduced, means forming a reference transducer on said surface spaced from the input transducer in the direction therefrom of signal propagation, means connected to the reference transducer for sensing a propagated signal at the time it moves thereby and producing an output, an adjustable transducer located closely adjacent to the surface and movable relative thereto toward and away from the reference transducer in the direction of signal propagation, output means connected to the adjustable transducer for producing an output response at the time when a propagated signal moves thereby, means for comparing the time of occurrence of the propagated signal as sensed at the reference transducer and at the adjustable transducer to determine the phase relationship therebetween, and means for producing an output indication when the compared responses have a preestablished phase relationship.

7. The means defined in claim 6 wherein a second crystal member having structural and electrical characteristics similar to the aforesaid crystal member is fixedly attached to the aforesaid crystal member for movement therewith relative to the adjustable transducer, and camera means associated with said second crystal member and movable relative thereto in concert with the adjustable transducer, said camera means including means for exposing the surface of the second crystal member to an image of an electrode to be located thereon at positions corresponding to predetermined positions of the adjustable transducer relative to the crystal member.

8. The means defined in claim 6 including a dual beam oscilloscope having a first input connected to receive responses sensed by the reference transducer and a second input connected to receive responses sensed by the adjustable transducer.

9. The means defined in claim 8 including a precision oscillator and a pulse generator connected to the input transducer to excite said transducer to propagate a signal over the surface of the crystal member, and digital delay means connected to the precision oscillator including means to connect the output of the delay means to the oscilloscope.

10. Means for accurately locating images of electrodes on a photomask to be used in the construction of an acoustic surface wave device including a photomask, a crystal member similar in structural and operational characteristics to that for which the photomask is being prepared, means mounting said crystal and photomask members for movement in concert, camera means associated with the photomask member including means for exposing selected areas of the surface of said photomask member to an image of an electrode to be formed thereon, said crystal member having an input transducer formed on the surface thereof, means for applying a signal to the input transducer for propagation thereby over the crystal surface, sensor means positioned adjacent to the surface of said crystal member and means for moving the crystal member relative thereto in a direction to move the sensor means toward or away from the input transducer to sense a signal being propagated at different locations therealong, means for moving the camera means in concert with the sensor means and relative to the photomask member to establish different optical relationships between the camera means and the surface of the photomask member, means for making phase comparisons between the signal applied to the input transducer for propagation and the signal sensed by the sensor means, and means for exposing the photomask member to the electrode image at preselected positions as determined by the phase comparison means.

11. The means defined in claim 10 wherein the means for applying signals to the input transducer for propagation include means for applying continuous wave signals, and cycle counting means connected to said sensor means for counting cycles of a propagated signal as the sensor means moves toward or away from the input transducer.

12. The means defined in claim 10 wherein said sensor means is mounted in a fixed position and the crystal and photomask members are mounted for movement relative thereto.

13. The means defined in claim 10 including means for maintaining the sensor means closely adjacent to the surface of the crystal member during relative movements therebetween.

14. The means defined in claim 13 wherein the means for maintaining the sensor means closely adjacent to the surface of the crystal member include track means formed on one of the members for engagement by the other.

15. The means defined in claim 10 wherein the camera means includes a pictorial representation of an electrode location for producing on the photomask member, said pictorial representation including a plurality of closely spaced parallel members, and means connecting opposite ends of alternate ones of the spaced parallel members together.

16. The means for accurately locating images of electrodes on a photomask defined in claim 10 wherein the photomask is a glass plate having a photosensitized coating applied thereto.

17. Means for accurately locating images of electrodes on a photomask to be used in the construction of an acoustic surface wave device including first and second crystal members of similar structural and operational characteristics, means mounting said first and second crystal members for movement in concert, camera means associated with the first crystal member including means for exposing selected areas of the surface of said first crystal member to an image of an electrode to be formed thereon, said second crystal member having an input transducer formed on the surface thereof, means for applying a signal to the input transducer for propagation thereby over the crystal surface of said second crystal member, sensor means positioned adjacent to the surface of said second crystal member and means for moving the second crystal member relative thereto in a direction to move the sensor means toward or away from the input transducer to sense a signal being propagated at different locations therealong, means for moving the camera means in concert with the sensor means and relative to the first crystal member to establish a different optical relationship between the camera means and the surface of the first crystal member, means for making phase comparisons between the signal applied to the input transducer for propagation and the signal sensed by the sensor means, and means for exposing the first crystal member to the electrode image at preselected positions of said first and second crystal members as determined by the phase comparison means.

18. Means for accurately locating images of electrodes on a photomask to be used in construction of acoustic surface wave devices comprising a photomask member, a reference piezoelectric member having structural and operational characteristics similar to that for which the photomask is being prepared, means for mounting said reference and said photomask members in fixed relationship to each other, means for exposing selected areas of the photomask member to an image of an electrode to be formed thereon including camera means and means in the camera means forming an optical image of the electrode to be formed, and means for selectively relocating the photomask member relative to the camera means to expose the surface of said photomask member to the image in different positions thereof whereby locations for spaced electrodes are photographically recorded on the surface of said photomask member, said last named means including means for propagating a signal along the surface of the reference crystal member commencing at a predetermined location thereon, and means for sensing the propagated signal at different locations along the surface of the reference crystal including means for comparing the phase of the signal being propagated at at least two different locations on the surface of the reference signal as it is being propagated, said phase comparison means including means for producing relative movement between the photomask member and the reference crystal member relative to the sensing means and the camera means, and means for optically exposing the photomask member to the image of the electrode in preselected positions as determined by phase comparison means.

19. The means defined in claim 18 wherein the phase comparison means includes means connected to the reference crystal at the location where the signal is propagated and to the sensing means.

20. The means defined in claim 18 wherein a reference transducer is located on the reference crystal member at a location on the surface thereof spaced from the location where the signal to be propagated is introduced, and means connecting the reference transducer and the sensing means to the phase comparison means.

21. The means defined in claim 18 wherein said sensing means include a sensor member having a transducer formed thereon, and means for producing relative movement between the surface of the reference crystal member and the transducer on the sensor member.

22. The means defined in claim 21 including means to maintain a predetermined spaced relationship between the transducer on the sensor member and the surface of the reference crystal member during relative movements therebetween.

* * * * *